(12) United States Patent
Joe (10) Patent No.: US 11,402,075 B2
(45) Date of Patent: Aug. 2, 2022

(54) VEHICLE LAMP USING SEMICONDUCTOR LIGHT-EMITTING DEVICE

(71) Applicant: LG ELECTRONICS INC., Seoul (KR)

(72) Inventor: Jinhyoun Joe, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 19 days.

(21) Appl. No.: 16/959,963

(22) PCT Filed: Jan. 3, 2018

(86) PCT No.: PCT/KR2018/000119
§ 371 (c)(1),
(2) Date: Jul. 2, 2020

(87) PCT Pub. No.: WO2019/135421
PCT Pub. Date: Jul. 11, 2019

(65) Prior Publication Data
US 2021/0062989 A1 Mar. 4, 2021

(51) Int. Cl.
| | |
|---|---|
| *F21S 41/141* | (2018.01) |
| *F21S 43/14* | (2018.01) |
| *H01L 23/538* | (2006.01) |
| *H01L 25/075* | (2006.01) |
| *H01L 33/40* | (2010.01) |
| *H01L 33/62* | (2010.01) |

(52) U.S. Cl.
CPC ............ *F21S 41/141* (2018.01); *F21S 43/14* (2018.01); *H01L 23/5387* (2013.01); *H01L 25/0753* (2013.01); *H01L 33/40* (2013.01); *H01L 33/62* (2013.01)

(58) Field of Classification Search
None
See application file for complete search history.

(56) References Cited

U.S. PATENT DOCUMENTS

| | | | |
|---|---|---|---|
| 2011/0204387 A1 | 8/2011 | Kim et al. | |
| 2015/0228865 A1* | 8/2015 | Rhee | H01L 33/50 257/90 |
| 2021/0043819 A1* | 2/2021 | Lee | F21S 43/15 |

FOREIGN PATENT DOCUMENTS

| | | |
|---|---|---|
| JP | 2008-4365 A | 1/2008 |
| KR | 10-2014-0030887 A | 3/2014 |
| KR | 10-1803874 B1 | 12/2017 |
| KR | 10-2018-0000254 A | 1/2018 |

* cited by examiner

*Primary Examiner* — Ashok Patel
(74) *Attorney, Agent, or Firm* — Birch, Stewart, Kolasch & Birch, LLP (57) ABSTRACT

Discussed is a vehicle lamp using a semiconductor light-emitting device. The vehicle lamp includes a light source unit for emitting light. The light source unit includes a base substrate; a first electrode arranged on the base substrate; a plurality of semiconductor light-emitting devices arranged on the first electrode; and a second electrode arranged on upper sides of the semiconductor light-emitting devices and arranged so as to overlap with the semiconductor light-emitting devices, wherein the second electrode includes a plurality of protruding electrodes protruding toward a lower side of the second electrode, and the protruding electrodes can come in contact with the semiconductor light-emitting devices such that the protruding electrodes are electrically connected to the semiconductor light-emitting devices.

9 Claims, 6 Drawing Sheets

VEHICLE LAMP USING SEMICONDUCTOR LIGHT-EMITTING DEVICE

CROSS-REFERENCE TO RELATED APPLICATIONS

This application is the National Stage filing under 35 U.S.C. 371 of International Application No. PCT/KR2018/000119 tiled on Jan. 3, 2018, which is hereby expressly incorporated by reference into the present application.

TECHNICAL FIELD

The present disclosure relates to a vehicle lamp (or automotive lamp), and more particularly, a vehicle lamp using a semiconductor light-emitting device.

BACKGROUND

A vehicle is equipped with various lamps having lighting functions and signaling functions. In general, halogen lamps or gas discharge lamps are usually used, but in recent years, light-emitting diodes (LEDs) are in the spotlight as light sources for automotive lamps.

The LED can enhance a degree of freedom for design of a lamp by minimizing a size thereof and exhibit economical efficiency by virtue of a semi-permanent lifespan, but most of the LEDs are currently produced in a form of a package. The LED itself other than the package is under development as a semiconductor light-emitting device of converting a current into light, namely, an image displaying light source equipped in an electronic device such as an information communication device.

However, automotive lamps developed to date use LEDs in the package form, and therefore have disadvantages, such as a low mass production yield rate and high costs. In addition, a light amount or quantity is insufficient for the lamp to illuminate.

DISCLOSURE

Technical Problem

One aspect of the present disclosure is to provide a structure for preventing a short circuit caused by a difference in thermal expansion coefficient between a contact portion and a non-contact portion of a semiconductor light-emitting device and a metal electrode when a current flows through the metal electrode.

Another aspect of the present disclosure is to provide an electrode structure capable of stably supplying a high current to a semiconductor light-emitting device in order to secure a sufficient light amount of a lamp.

Technical Solution

Embodiments disclosed herein provide a vehicle lamp having a light source unit that emits light. The light source unit may include a base substrate, a first electrode disposed on the base substrate, a plurality of semiconductor light-emitting devices disposed on the first electrode, and a second electrode disposed at upper sides of the semiconductor light-emitting devices in a manner of overlapping the semiconductor light-emitting devices. The second electrode may be provided with a plurality of protruding electrodes protruding downward therefrom, and the protruding electrodes may be in contact with the semiconductor light-emitting devices so as to be electrically connected.

In one embodiment, a light transmitting layer disposed between the semiconductor light-emitting devices and the second electrode may be further provided. The protruding electrodes may penetrate through the light transmitting layer to be in contact with the respective semiconductor light-emitting devices.

In one embodiment, the light transmitting layer may include a plurality of electrode holes that overlaps the semiconductor light-emitting devices.

In one embodiment, each of the semiconductor light-emitting devices may include a first conductive type electrode electrically connected to the first electrode, a first conductive type semiconductor layer disposed on the first conductive type electrode, an active layer disposed on the first conductive type semiconductor layer, a second conductive type semiconductor layer having a protruding portion protruding in a lateral direction of the semiconductor light-emitting device, and disposed on the active layer, and a second conductive type electrode disposed on the protruding portion.

In one embodiment, of an entire region of the second electrode, the protruding electrode may protrude from an overlapping region with the protruding portion.

In one embodiment, the protruding electrode may not overlap the active layer.

In one embodiment, the second electrode and the protruding electrodes may include a first electrode layer made of Ni or Cr and disposed at the bottom, and a second electrode layer made of Al or Ag and disposed on the first electrode layer.

In one embodiment, the second electrode and the protruding electrodes may further include a third electrode layer made of Au and disposed on the second electrode layer.

In one embodiment, the second electrode and the protruding electrodes may further include an intermediate layer made of conductive nanoparticles or conductive graphene and disposed between the first electrode layer and the second electrode layer.

Advantageous Effects

According to one embodiment, a contact area between a metal electrode and an upper surface of a semiconductor light-emitting device is very large, and thus heat can be evenly or uniformly generated throughout the semiconductor light-emitting device when a current is supplied to the semiconductor light-emitting device. As a result, a short circuit between the semiconductor light-emitting device and the electrode caused by uneven thermal expansion can be prevented.

Further, according to one embodiment, as a contact area between a metal electrode and a semiconductor light-emitting device is large, a maximum amount of current can be supplied to the semiconductor light-emitting device. This can lead to an increase in amount of light of a lamp.

BEST MODE OF CARRYING OUT EMBODIMENTS

Description will now be given in detail according to exemplary embodiments disclosed herein, with reference to the accompanying drawings. For the sake of brief description with reference to the drawings, the same or equivalent components may be provided with the same or similar reference numbers, and description thereof will not be repeated. In general, a suffix such as "module" and "unit" may be used to refer to elements or components. Use of such a suffix herein is merely intended to facilitate description of the specification, and the suffix itself is not intended to give any special meaning or function. In describing the present disclosure, if a detailed explanation for a related known function or construction is considered to unnecessarily divert the main point of the present disclosure, such explanation has been omitted but would be understood by those skilled in the art. The accompanying drawings are used to help easily understand the technical idea of the present disclosure and it should be understood that the idea of the present disclosure is not limited by the accompanying drawings.

It will be understood that when an element such as a layer, area or substrate is referred to as being "on" another element, it can be directly on the element, or one or more intervening elements may also be present.

A vehicle lamp described in this specification may include a head lamp, a tail lamp, a position lamp, a fog lamp, a turn signal lamp, a stop (or brake) lamp, a hazard (or emergency) lamp, a backup lamp, and the like. However, it will be readily apparent to those skilled in the art that the configuration according to the embodiments described herein may also be applied to a new product type that will be developed later if the device is a device capable of emitting light.

Figure 1:
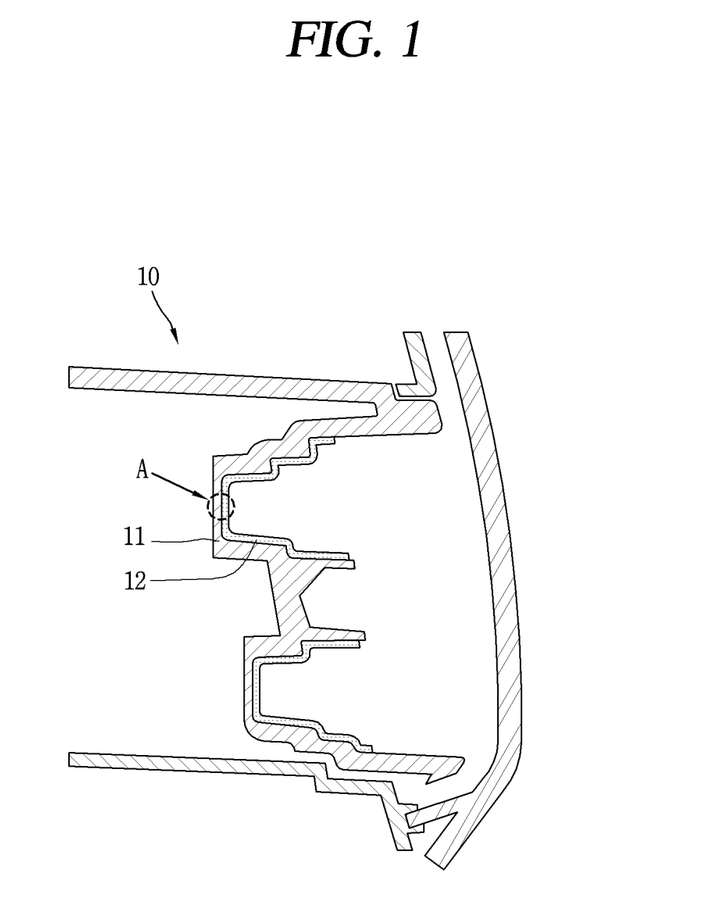
FIG. 1 is a conceptual view illustrating one embodiment of a vehicle lamp using a semiconductor light-emitting device according to the present disclosure.

FIG. 1 is a conceptual view illustrating one embodiment of a vehicle lamp using a semiconductor light-emitting device according to the present disclosure.

A vehicle lamp 10 according to one embodiment of the present disclosure includes a frame 11 fixed to a vehicle body, and a light source unit 12 installed on the frame 11.

A wiring line for supplying power to the light source unit 12 may be connected to the frame 11, and the frame 11 may be fixed to the vehicle body directly or by using a bracket. As illustrated, the vehicle lamp 10 may be provided with a lens unit to more diffuse and sharpen light emitted from the light source unit 12.

The light source unit 12 may be a flexible light source unit that can be curved, bent, twisted, folded, or rolled by an external force.

In a non-curved state of the light source unit 12 (e.g., a state having an infinite radius of curvature, hereinafter, referred to as a "first state"), the light source unit 12 is flat. When the first state is switched to a state that the light source unit 12 is bent by an external force (e.g., a state having a finite radius of curvature, hereinafter, referred to as a second state), the flexible light source unit 12 may have a curved surface with at least part curved or bent.

A pixel of the light source unit 12 may be implemented by a semiconductor light-emitting device. The present disclosure exemplarily illustrates a light-emitting diode (LED) as a type of semiconductor light-emitting device for converting a current into light. The LED has a small size, thereby serving as a pixel even in the second state.

Meanwhile, the light source unit 12 according to the present disclosure includes a unit light source, a base substrate, and a connection (or connecting) electrode. Hereinafter, the above-mentioned constituent elements (components) will be described in detail.

The light source unit 12 may be provided with only the unit light source. Hereinafter, the unit light source will be described in detail based on the light source unit 12 provided with only the unit light source.

Figure 2:
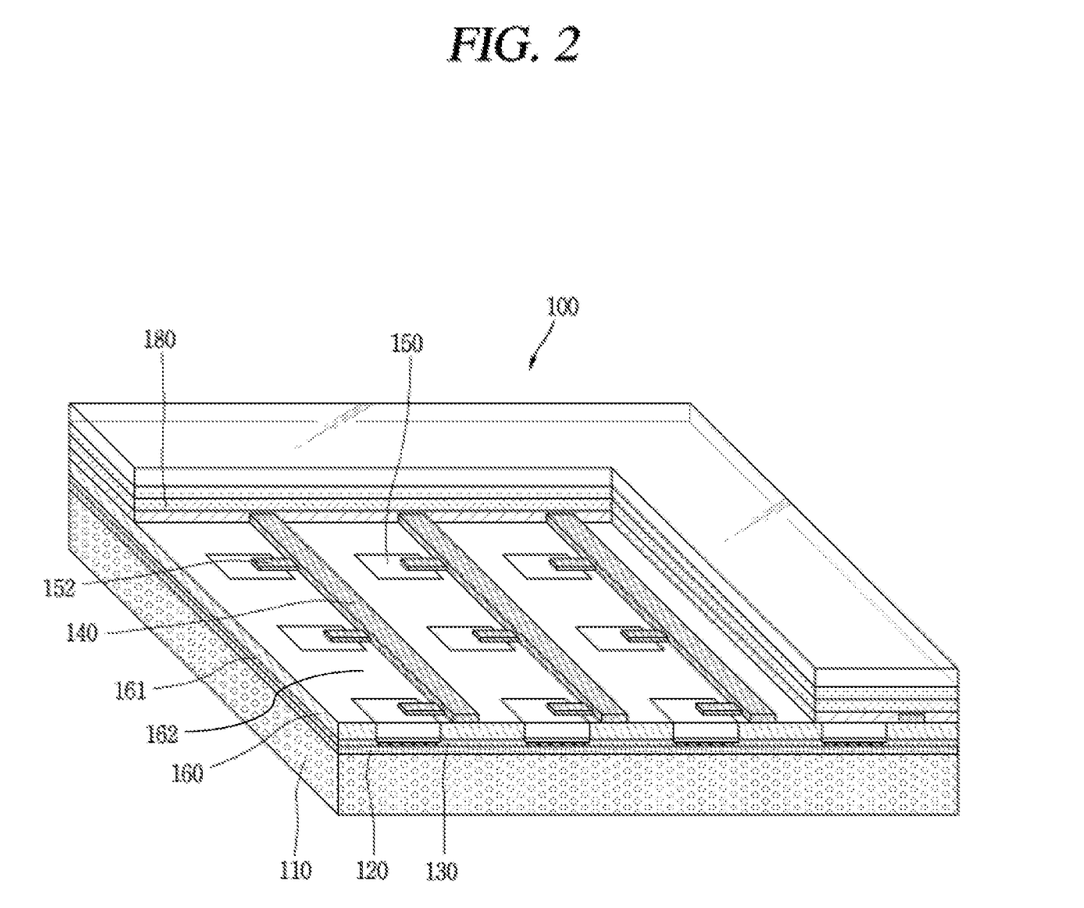
FIG. 2 is a partially enlarged view of a part A in FIG. 1.
Figure 3:
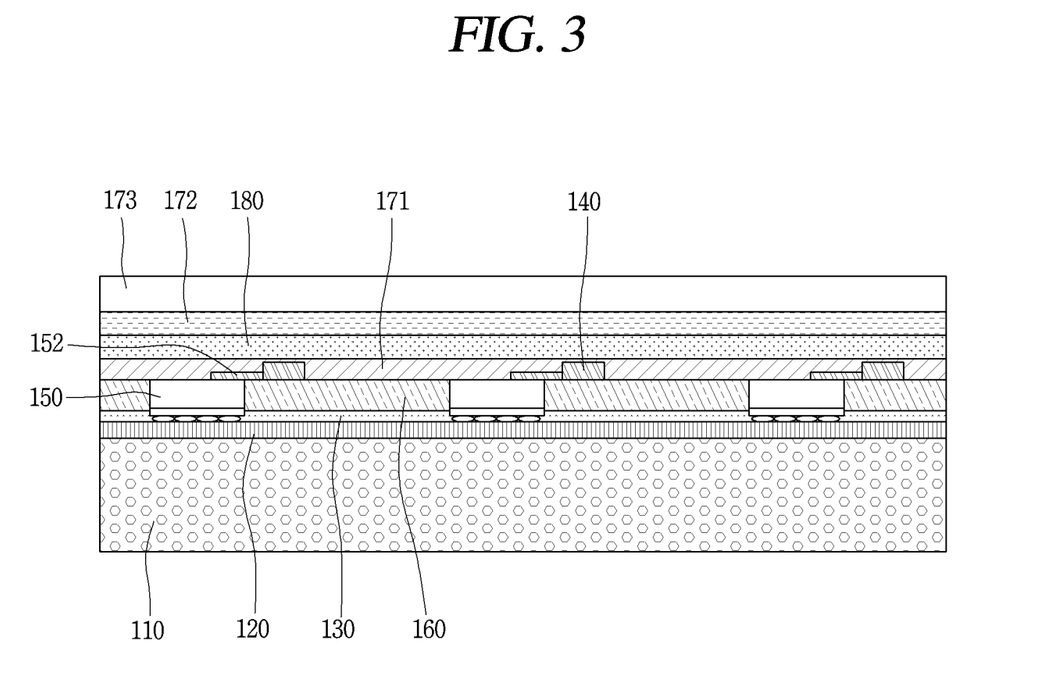
FIG. 3 is a cross-sectional view of a part A in FIG. 1.
Figure 4:
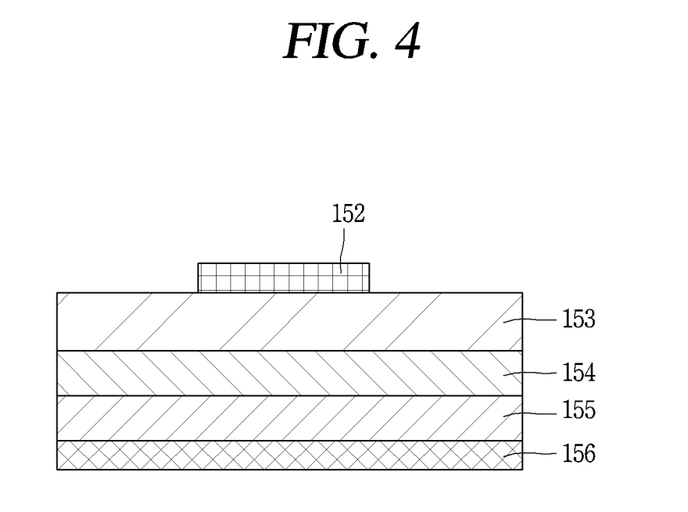
FIG. 4 is a conceptual view illustrating a vertical type semiconductor light-emitting device of FIG. 3.

FIG. 2 is a partially enlarged view of a part A in FIG. 1, FIG. 3 is a cross-sectional view of the part A in FIG. 1, and FIG. 4 is a conceptual view illustrating a vertical type semiconductor light-emitting device of FIG. 3.

Referring to FIGS. 2, 3 and 4, a passive matrix (PM) type semiconductor light-emitting device is used as the unit light source 100 using the semiconductor light-emitting device. However, an example described below may also be applicable to an active matrix (AM) type semiconductor light-emitting device.

The unit light source 100 may include a (base) substrate 110, a first electrode 120, a first adhesive layer 130, a second electrode 140, and a plurality of semiconductor light-emitting devices 150.

The substrate 110 is a base layer on which a structure is formed through an entire process, which may be a wiring substrate on which the first electrode 120 is disposed. The substrate 110 may be formed of glass or polyimide (PI) to implement a flexible light source unit. In addition, the substrate 110 may be made of a thin metal. The substrate 110 may alternatively be made of any material with insulating property and flexibility, for example, polyethylene naphthalate (PEN), polyethylene terephthalate (PET), and the like. Further, the substrate 110 may be either one of transparent and non-transparent materials.

Meanwhile, a heat dissipating sheet, a heat sink, or the like may be mounted on the substrate 110 to achieve a heat dissipating function. Here, the heat dissipating sheet, the heat sink, or the like may be mounted on an opposite surface of a surface on which the first electrode 120 is disposed.

The first electrode 120 is disposed on the substrate 110, and may be formed as a surface (shaped) electrode. Therefore, the first electrode 120 may be an electrode layer disposed on the substrate, and may serve as a data electrode. Meanwhile, an electrode pad may be disposed on the first electrode 120 to facilitate electrical connection to a connection electrode.

The first adhesive layer 130 is formed on the substrate 110 where the first electrode 120 is located.

The first adhesive layer 130 may be a layer having adhesiveness and conductivity. To this end, a conductive material and an adhesive material may be mixed on the first adhesive layer 130. Therefore, the first adhesive layer may be referred to as a first conductive adhesive layer. Further, the first adhesive layer 130 may have flexibility to enable a flexible function in the light source unit.

For such an example, the first adhesive layer 130 may be an anisotropic conductive film (ACF), an anisotropic conductive paste, a solution containing conductive particles, and the like. The first adhesive layer 130 may be configured to allow electrical interconnection in a z-direction that passes through its thickness, but to have electrical insulation in a horizontal x-y direction. Accordingly, the first adhesive layer 130 may be referred to as a Z-axis conductive layer.

The anisotropic conductive film is a film in which an anisotropic conductive medium is mixed with an insulating base member. When heat and pressure are applied, only a specific portion has conductivity by the anisotropic conductive medium. Hereinafter, description will be given of an example that heat and pressure are applied to the anisotropic conductive film, but other methods may alternatively be used to allow the anisotropic conductive film to partially have conductivity. For example, applying either the heat or the pressure, UV curing, and the like.

In addition, the anisotropic conductive medium may be, for example, a conductive ball or a conductive particle. According to this embodiment, the anisotropic conductive film is a film in which conductive balls are mixed with an insulating base member. When heat and pressure are applied, only a specific portion of the anisotropic conductive film obtains conductivity by the conductive balls. The anisotropic conductive film may be a state of containing a plurality of particles each of which a core of a conductive material is coated with an insulating film made of a polymer material. At this time, the insulating film of a portion to which heat and pressure have been applied is broken and thus obtains the conductivity by the core. Here, the shape of the core may be deformed to form a layer in contact with the film in a thickness direction of the film. In more detail, heat and pressure are applied throughout the anisotropic conductive film, and electrical connection in the Z-axis direction is partially formed by a height difference of an object adhered by the anisotropic conductive film.

As another example, the anisotropic conductive film may be a state of containing a plurality of particles each of which the insulating core is coated with the conductive material. In this case, the conductive material in the portion, to which the heat and pressure have been applied, is deformed (stuck, pressed), and thus the portion has the conductivity in the thickness direction of the film. Alternatively, the conductive material may penetrate through the insulating base member in the Z-axis direction so that the film has the conductivity in its thickness direction. In this case, the conductive material may have a sharp end portion.

The anisotropic conductive film may be a fixed array anisotropic conductive film (ACF) in which conductive balls are inserted into one surface of the insulating base member. More specifically, the insulating base member is formed of a material having adhesiveness, and the conductive balls are concentrated on a bottom portion of the insulating base member. When heat and pressure are applied to the base member, the base member is deformed together with the conductive balls so as to obtain conductivity in a perpendicular (or vertical) direction.

However, the present disclosure is not limited thereto. The anisotropic conductive film may alternatively be formed by randomly inserting conductive balls into the insulating base member, or may be configured in the form of double-ACF in which a plurality of layers is provided and the conductive balls are disposed in one of the layers.

The anisotropic conductive paste is a combination of a paste and conductive balls, namely, may be a paste in which conductive balls are mixed with a base material having insulating property and adhesiveness. In addition, the solution containing conductive particles may be a solution in which conductive particles or nanoparticles are contained.

When an anisotropic conductive film is disposed in a state that the first electrode 120 is located on the substrate 110, heat and pressure are applied to connect the semiconductor light-emitting device 150 thereto. Then, the semiconductor light-emitting device 150 is electrically connected to the first electrode 120. Here, the semiconductor light-emitting device 150 may be preferably disposed on the first electrode 120. In addition, as the anisotropic conductive film contains an adhesive component, the first adhesive layer 130 provides not only electrical connection, but also mechanical coupling between the semiconductor light-emitting device 150 and the first electrode 120.

As another example, the first adhesive layer 130 may be made of tin-based alloy, Au, Al, Pb, or the like for eutectic bonding, and the substrate 110 and the semiconductor light-emitting device 150 may be joined by eutectic bonding.

Since the semiconductor light-emitting device 150 has excellent luminance, it can constitute an individual unit pixel even though it has a small size. The size of the individual semiconductor light-emitting device 150 may be less than or equal to 80 μm of one side thereof, and may be a rectangular or square shaped device. In this case, an area of a single semiconductor light-emitting device is in the range of $10^{-10}$ to $10^{-5}$ m$^2$, and an interval (or gap) between the light-emitting devices may be in the range of 100 um to 10 mm.

The semiconductor light-emitting device 150 may have a vertical structure.

A plurality of second electrodes 140 is located between the vertical type semiconductor light-emitting devices 150, and the plurality of second electrodes 140 is electrically connected to the semiconductor light-emitting devices 150, respectively.

Referring to FIG. 4, the vertical type semiconductor light-emitting device includes a p-type electrode 156, a p-type semiconductor layer 155 formed on the p-type electrode 156, an active layer 154 formed on the p-type semiconductor layer 155, an n-type semiconductor layer 153 formed on the active layer 154, and an n-type electrode 152 formed on the n-type semiconductor layer 153. Here, the p-type electrode 156 located at the bottom may be electrically connected to the first electrode 120 by the first adhesive layer 130, and the n-type electrode 152 located at the top may be electrically connected to the second electrode 140 which will be described hereinafter. Electrodes may be disposed in an up/down (or vertical) direction in the vertical type semiconductor light-emitting device 150, thereby providing a great advantage of reducing the chip size.

Referring back to FIGS. 2 and 3, the plurality of semiconductor light-emitting devices 150 constitutes a light-emitting device array, and an insulating layer 160 is provided between the plurality of semiconductor light-emitting devices 150. For instance, the insulating layer 160 includes a first part 161 that is formed on one surface of the first adhesive layer 130 and a second part 162 to fill a space between the semiconductor light-emitting devices 150.

However, the present disclosure is not necessarily limited thereto, and alternatively employs a structure in which the adhesive layer 130 fully fills the gap between the semiconductor light-emitting devices without the insulating layer 160.

The insulating layer 160 may be a transparent insulating layer including silicon oxide (SiOx), and the like. As another example, the insulating layer 160 may be made of epoxy having excellent insulation property and low light absorption, a polymer material such as methyl-based silicone and phenyl-based silicone, or an inorganic material such as SiN, Al2O3, and the like, in order to prevent a short circuit between electrodes.

In the drawings, a phosphor layer 180 is provided at the light-emitting element array.

The phosphor layer 180 may be provided on one surface of the semiconductor light-emitting device 150. For example, the semiconductor light-emitting device 150 may be a blue semiconductor light-emitting device that emits blue (B) light, and the phosphor layer 180 for converting the blue (B) light into another color may be provided thereon. Here, the phosphor layer 180 may include a red phosphor capable of converting blue light into red (R) light, a green phosphor capable of converting blue light into green (G) light, or a yellow phosphor capable of converting blue light into white (W) light.

Here, the wavelength of light in a Nitride-based semiconductor light-emitting device has a range of 390 to 550 nm, which may be converted to 450 to 670 nm through a film in which a phosphor is inserted. As another example, the phosphor layer 180 may include all of the red phosphor and the green phosphor to mix light of various wavelengths so as to realize white light. Further, in a GaAs-based red semiconductor light-emitting device, a light diffusion film may be used instead of a phosphor when red-based light is required. In addition, a patterned sheet may be inserted to improve light extraction efficiency.

In this case, an optical gap layer may be provided between the semiconductor light-emitting device 150 and the phosphor layer 180. The optical gap layer may be made of a material having low light absorption and excellent bending property such as epoxy and acrylic, or methyl-based silicone, phenyl-based silicone, and the like. In addition, in order to optimize light efficiency, a patterned sheet may be inserted, or particles having different refractive indices may be mixed.

Meanwhile, a color filter 172 may also be disposed on the phosphor layer 180 to improve color purity of converted light. In addition, the color filter 172 may be covered by a protective layer 173 to protect the light source unit from moisture, oxygen, and external impact. At this time, the protective layer 173 may be formed by bonding a film or coating resin.

Hereinafter, embodiments of the present disclosure will be described with the aforementioned components.

The present disclosure relates to a vehicle lamp using the vertical type semiconductor light-emitting device. As described in FIG. 2, in order to supply a current to the vertical type semiconductor light-emitting device, the second electrode 140 should overlap the n-type electrode 152 at an upper side of the semiconductor light-emitting device. Conventionally, an overlapping area between the second electrode and the n-type electrode is minimized. As an example, the second electrode and the n-type electrode are not overlapped with each other, and a protrusion (or protruding portion) protruding from the second electrode forms an ohmic contact with the n-type electrode, so as to minimize the overlapping area between the electrode and the semiconductor light-emitting device.

However, as described above, when the overlapping area is minimized, a current is only supplied to a specific portion or region of the semiconductor light-emitting device. At this time, a different amount of heat is generated in the portion where the current is supplied (hereinafter, a first region) and in a portion where the current is not supplied (hereinafter, a second region). In more detail, a relatively large amount of heat is generated in the first region, thereby having a relatively high thermal expansion coefficient. The second region has a lower thermal expansion coefficient than the first region. The semiconductor light-emitting device is deformed unevenly due to the difference in thermal expansion coefficient.

In the vehicle lamp, a large amount of current is supplied to the semiconductor light-emitting device to secure an amount of light, thereby causing large uneven deformation of the semiconductor light-emitting device. As a result, a short circuit between the semiconductor light-emitting device and the electrode may occur.

Hereinafter, a structure for preventing non-uniform deformation of the semiconductor light-emitting device during a current supply will be described.

Figure 5:
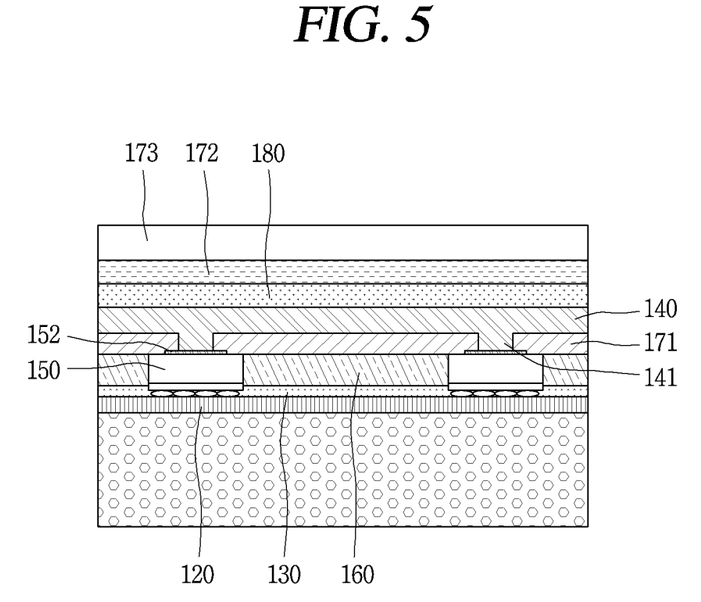
FIG. 5 is a cross-sectional view of a lamp according to one embodiment of the present disclosure.

FIG. 5 is a cross-sectional view of a lamp according to one embodiment of the present disclosure.

The lamp according to the present disclosure may include at least some of the components described in FIGS. 2 to 4. In detail, the lamp according to the present disclosure includes the first electrode 120, the vertical type semiconductor light-emitting device 150, and the second electrode 140. A related description will be replaced by the description with reference to FIGS. 2 to 4.

Referring to FIG. 5, the lamp according to this embodiment includes the second electrode 140 disposed at upper sides of the semiconductor light-emitting devices 150 in an overlapping manner. In addition, the second electrode 140 includes a plurality of protruding electrodes 141 protruding downward therefrom. The protruding electrodes 141 are in contact with the semiconductor light-emitting devices 150 to be electrically connected thereto.

Here, the second electrode 140 is not disposed on the same plane as an upper surface of each of the semiconductor light-emitting devices 150, and is disposed above the semiconductor light-emitting devices 150. More specifically, a light transmitting layer 171 may be disposed between the semiconductor light-emitting devices 150 and the second electrode 140. That is, the semiconductor light-emitting devices 150 may be covered by the light transmitting layer 171 made of a light transmissive material, and the second electrode 140 may be disposed on the light transmitting layer 171.

Meanwhile, each of the protruding electrodes 141 protruding from the second electrode 140 may penetrate through the light transmitting layer 171 to be in contact with the upper surfaces of the respective semiconductor light-emitting devices 150. To this end, the light transmitting layer 171 may include a plurality of electrode holes that overlaps the semiconductor light-emitting devices 150. The protruding electrode 141 is provided along the electrode hole, so as to be electrically connected to the semiconductor light-emitting device 150.

As the second electrode 140 and the protruding electrode 141 overlap at least a part (or portion) of the semiconductor light-emitting device 150, light traveling upward of the semiconductor light-emitting device 150 may be absorbed or reflected. In order to minimize a loss of light to the lamp, the second electrode 140 and the protruding electrode 141 may be made of a material having high reflectivity. The material constituting the second electrode 140 and the protruding electrode 141 will be described hereinafter.

The second electrode 140 and the protruding electrode 141 overlap the upper surface of the semiconductor light-emitting device 150, but have a smaller area than the semiconductor light-emitting device 150. Accordingly, light emitted to a side (or lateral) surface of the semiconductor light-emitting device 150 and directed upward may be emitted to the outside without being disturbed by the second electrode 140 and the protruding electrode 141.

Meanwhile, when a reflector is provided beneath the semiconductor light-emitting device 150, light reflected by the second electrode 140 and the protruding electrode 141 may be reflected back through the reflector so as to be emitted to the outside.

With this structure, the electrode made of metal overlaps 90% or more of the upper surface of the semiconductor light-emitting device, allowing a current to be stably supplied to the semiconductor light-emitting device. According to this embodiment, a contact area between the metal electrode and the semiconductor light-emitting device is large, which may prevent uneven heat generation in the semiconductor light-emitting device while a current is supplied.

According to the present disclosure, a structure capable of stably supplying a current to the semiconductor light-emitting device and maximizing a light amount (or quantity) of the lamp is provided. More specifically, a structure for minimizing the overlapping area between the semiconductor light-emitting device and the protruding electrode is provided.

Figure 6:
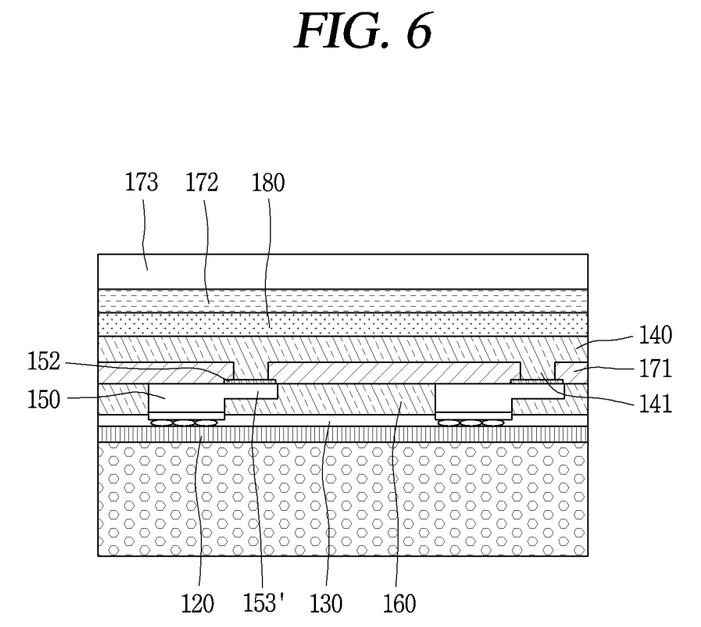
FIG. 6 is a cross-sectional view of a lamp according to a modified embodiment of the present disclosure.

FIG. 6 is a cross-sectional view according to a modified embodiment of the present disclosure.

The semiconductor light-emitting device 150 according to this embodiment includes a first conductive type electrode (it is referred to as the p-type electrode in FIG. 4, but is not limited thereto) 156, a first conductive type semiconductor layer disposed or stacked on the first conductive type electrode (it is referred to as the p-type semiconductor layer in FIG. 4, but is not limited thereto) 155, an active layer 154, a second conductive type semiconductor layer (it is referred to as the n-type semiconductor layer in FIG. 4, but is not limited thereto) 153, and a second conductive type electrode (it is referred to as the n-type electrode in FIG. 4, but is not limited thereto) 152.

Here, the second conductive type semiconductor layer 153 includes a protruding portion 153' that protrudes in a lateral direction of the semiconductor light-emitting device 150. The protruding portion 153' extends from one surface of the semiconductor light-emitting device 150, and an upper surface of the protruding portion 153' is located on the same plane as an upper surface of the second conductive type semiconductor layer 153. In this case, the second conductive type electrode 152 may be disposed on the protruding portion 153'.

As the protruding portion 153' does not overlap the active layer 154, the protruding electrode 141 may not overlap the active layer 154 when the protruding electrode 141 is disposed to overlap the protruding portion 153'. The protruding electrode 141 protrudes from the second electrode 140 so as to overlap the protruding portion 153', and forms an ohmic contact with the second conductive type electrode 152.

With this structure, the protruding electrode 141 does not overlap the active layer 153, which may prevent light directed upward of the semiconductor light-emitting device 150 from being absorbed or reflected by the protruding electrode 141. As a result, the light amount of the lamp may be increased.

Meanwhile, as the second electrode 140 and the protruding electrode 141 are disposed at the upper side of the semiconductor light-emitting device 150, brightness of the lamp may be reduced. To minimize such a decrease in brightness of the lamp, a material having high reflectivity is used.

In detail, the second electrode 140 and the protruding electrodes 141 may be provided with a first electrode layer made of Ni or Cr and disposed at the bottom, and a second electrode layer made of Al or Ag and disposed on the first electrode layer.

The Ni or Cr is used for forming an ohmic contact with the second conductive type semiconductor layer, or for adhesion to the light transmitting layer. The metal used in the first electrode layer is not for increasing reflectivity of the electrode, so its thickness should be less than or equal to 5 nm.

The second electrode layer may be made of a material having high reflectivity. The second electrode layer increases reflectivity of the second electrode 140 and the protruding electrodes 141, thereby increasing brightness of the lamp.

Meanwhile, the second electrode 140 and the protruding electrodes 141 may further include a third electrode layer made of Au and disposed on the second electrode layer. The third electrode layer may be made of a material having high electrical conductivity to increase the amount of current supplied to the semiconductor light-emitting device.

In order to further increase reflectivity of the second electrode 140 and the protruding electrodes 141, the second electrode 140 and the protruding electrodes 141 may further include an intermediate layer made of conductive nanoparticles or conductive graphene disposed between the first electrode layer and the second electrode layer. The intermediate layer is made of a material having high reflectivity, thereby increasing reflectivity of the second electrode and the protruding electrodes.

As such, in this embodiment, the second electrode and the protruding electrode that overlap the semiconductor light-emitting device are made of a material having high reflectivity, so that light emitted from the semiconductor light-emitting device is reflected from the second electrode and the protruding electrode. This may allow the light amount of the lamp to be increased.

Hereinafter, four modified embodiments of the second electrode provided in the lamp according to the present disclosure will be described. FIGS. 7 to 10 are conceptual views respectively illustrating an electrode structure according to the present disclosure.

Although the second electrode and the semiconductor light-emitting devices are only illustrated in FIGS. 7 to 10 for enhancing understanding of the structure of the second electrode, the lamp illustrated in FIGS. 7 to 10 may include the components of the lamp.

Figure 7:
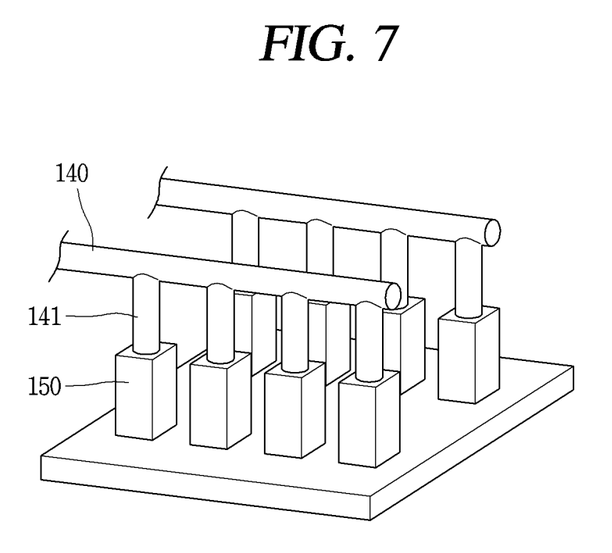
FIGS. 7 to 10 are conceptual views respectively illustrating, an electrode structure of the lamp according to the present disclosure.

As illustrated in FIG. 7, the protruding electrode 141 protruding from the second electrode 140 may overlap 90% or more of the upper surface of the semiconductor light-emitting device 150. In this case, the protruding electrode 141 overlaps 90% or more of the active layer 154 of the semiconductor light-emitting device 150. Accordingly, light traveling upward of the semiconductor light-emitting device 150 may be reflected by the protruding electrode 141. This electrode structure allows the largest amount of current to be supplied to the semiconductor light-emitting device of all the embodiments described with reference to FIGS. 7 to 10. With the structure of FIG. 7, a current may be stably supplied to the semiconductor light-emitting devices 150, thereby increasing the amount of current supplied to the semiconductor light-emitting devices 150. As a result, the light amount of the lamp may be increased.

Figure 8:
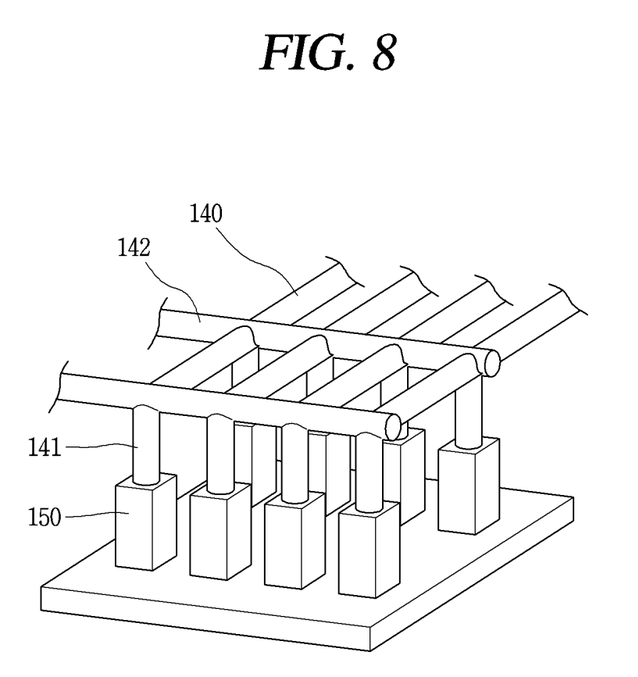

Meanwhile, as shown in FIG. 8, a plurality of second electrodes 140 may be connected to each other in parallel. To this end, a connection (or connecting) electrode 142 may be provided between the second electrodes 140. A current supplied to the semiconductor light-emitting devices 150 may be evenly distributed through the connection electrodes 142.

Figure 9:
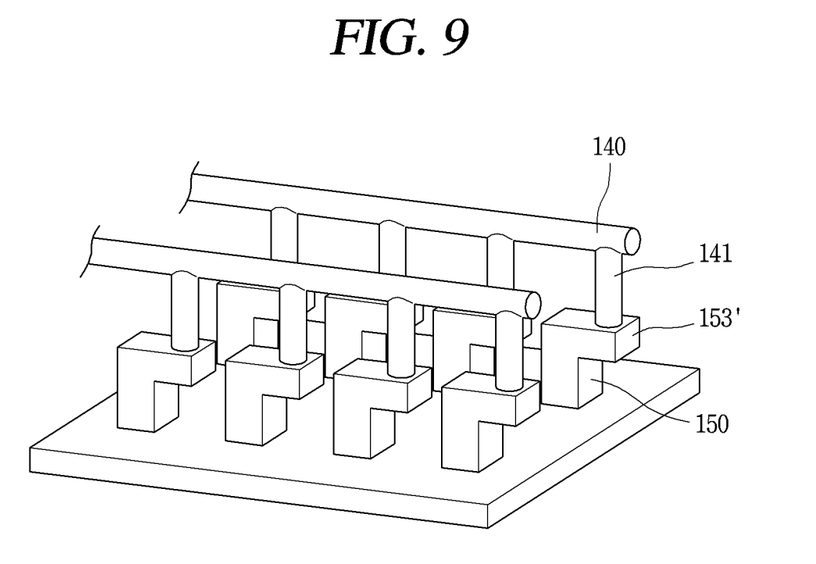

Alternatively, as illustrated in FIG. 9, the second conductive type semiconductor layer of the semiconductor light-emitting device 150 may have the protruding portion 153', and the second conductive type electrode may be formed on the protruding portion 153'. Here, the protruding electrode 141 protruding from the second electrode 140 may overlap the protruding portion 153'. This electrode structure may maximize the light amount of the lamp by separating a current supply region and a light emission region.

Figure 10:
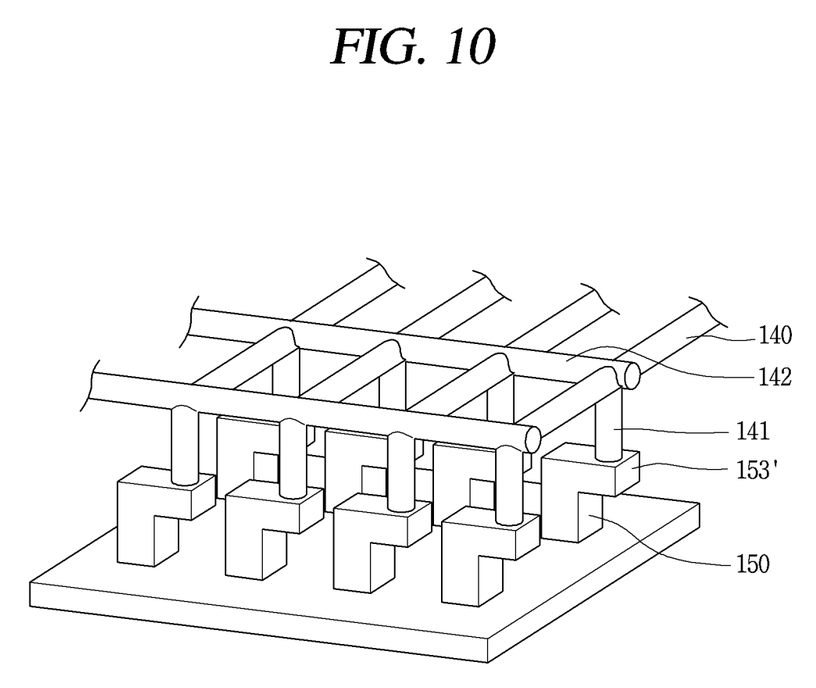

Further, as illustrated in FIG. 10, a plurality of second electrodes 140 may be connected to each other in parallel. To this end, the connection electrode 142 may be provided between the second electrodes 140. Accordingly, a current supplied to the semiconductor light-emitting devices 150 may be evenly distributed through the connection electrodes 142.

The aforementioned vehicle lamp using the semiconductor light-emitting device is not limited to the configuration and the method of the embodiments described above, but the embodiments may be configured such that all or some of the embodiments are selectively combined so that various modifications can be made.

The invention claimed is:

1. A vehicle lamp comprising:
a light source unit to emit light,
wherein the light source unit comprises:
a base substrate;
a first electrode disposed on the base substrate;
a plurality of semiconductor light-emitting devices disposed on the first electrode; and
a second electrode disposed at upper sides of the plurality of semiconductor light-emitting devices in a manner of overlapping the plurality of semiconductor light-emitting devices,
wherein the second electrode is provided with a plurality of protruding electrodes protruding downward therefrom,
wherein the plurality of protruding electrodes are in contact with the plurality of semiconductor light-emitting devices, respectively, so as to be electrically connected,
wherein the second electrode is provided as a plurality of second electrodes arranged parallel to each other, and
wherein the light source unit further comprises a connection electrode to connect adjacent pairs of the plurality of second electrodes.

2. The vehicle lamp of claim 1, further comprising a light transmitting layer disposed between the plurality of semiconductor light-emitting devices and a respective second electrode of the plurality of second electrodes,
wherein the plurality of protruding electrodes penetrate through the light transmitting layer to be in contact with the plurality of semiconductor light-emitting devices, respectively.

3. The vehicle lamp of claim 2, wherein the light transmitting layer includes a plurality of electrode holes that overlap the plurality of semiconductor light-emitting devices, respectively.

4. The vehicle lamp of claim 1, wherein each of the plurality of semiconductor light-emitting devices comprises:
a first conductive type electrode electrically connected to the first electrode;
a first conductive type semiconductor layer disposed on the first conductive type electrode;
an active layer disposed on the first conductive type semiconductor layer;
a second conductive type semiconductor layer having a protruding portion protruding in a lateral direction of each semiconductor light-emitting device, and disposed on the active layer; and
a second conductive type electrode disposed on the protruding portion, and
wherein a respective second electrode of the plurality of second electrodes includes an overlapping region that overlaps with the protruding portion of the second conductive type semiconductor layer, and the protruding electrode protrudes from the overlapping region of the respective second electrode.

5. The vehicle lamp of claim 4, wherein the protruding electrode does not overlap the active layer.

6. The vehicle lamp of claim 1, wherein a respective second electrode of the plurality of second electrodes and the plurality of protruding electrodes comprise:
a first electrode layer including Ni or Cr; and
a second electrode layer including Al or Ag and disposed on the first electrode layer.

7. The vehicle lamp of claim 6, wherein the respective second electrode and the plurality of protruding electrodes further include a third electrode layer including Au and disposed on the second electrode layer.

8. The vehicle lamp of claim 6, wherein the respective second electrode and the plurality of protruding electrodes further include an intermediate layer including conductive nanoparticles or conductive graphene and disposed between the first electrode layer and the second electrode layer.

9. A vehicle lamp comprising:
a light source unit to emit light,
wherein the light source unit comprises:
a base substrate;
a first electrode disposed on the base substrate;
a plurality of semiconductor light-emitting devices disposed on the first electrode; and
a second electrode disposed at upper sides of the plurality of semiconductor light-emitting devices in a manner of overlapping the plurality of semiconductor light-emitting devices,
wherein the second electrode is provided with a plurality of protruding electrodes protruding downward therefrom,
wherein the plurality of protruding electrodes are in contact with the plurality of semiconductor light-emitting devices, respectively, so as to be electrically connected, and
wherein the second electrode and the plurality of protruding electrodes comprise:
a first electrode layer including Ni or Cr; and
a second electrode layer including Al or Ag and disposed on the first electrode layer.

* * * * *